(12) United States Patent
Jin et al.

(10) Patent No.: US 12,284,899 B2
(45) Date of Patent: Apr. 22, 2025

(54) DISPLAY PANEL AND DISPLAY DEVICE

(71) Applicant: Wuhan China Star Optoelectronics Semiconductor Display Technology Co., Ltd., Hubei (CN)

(72) Inventors: Meng Jin, Hubei (CN); Lei Lv, Hubei (CN); Lin Yang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/638,872

(22) PCT Filed: Feb. 14, 2022

(86) PCT No.: PCT/CN2022/076165
§ 371 (c)(1),
(2) Date: Feb. 28, 2022

(87) PCT Pub. No.: WO2023/147709
PCT Pub. Date: Oct. 8, 2023

(65) Prior Publication Data
US 2024/0040894 A1  Feb. 1, 2024

(30) Foreign Application Priority Data

Feb. 7, 2022 (CN) .......................... 202210115902.4

(51) Int. Cl.
*H10K 59/80* (2023.01)
*H10K 59/126* (2023.01)

(52) U.S. Cl.
CPC ..... *H10K 59/80515* (2023.02); *H10K 59/126* (2023.02); *H10K 59/80521* (2023.02)

(58) Field of Classification Search
CPC ......... H10K 59/12; H10K 59/121–122; H10K 59/126; H10K 59/805–80524;
(Continued)

(56) References Cited

U.S. PATENT DOCUMENTS

2011/0284898 A1* 11/2011 Iwasaki ................. H10K 59/38
257/98
2021/0202621 A1* 7/2021 Liang ................. H10K 59/1216
(Continued)

FOREIGN PATENT DOCUMENTS

CN 107994034 5/2018
CN 109786582 5/2019
(Continued)

OTHER PUBLICATIONS

Chen, Ze-sheng, CN 111129092 A, Machine translation, May 8, 2020 (Year: 2020).*

(Continued)

*Primary Examiner* — Andres Munoz
*Assistant Examiner* — Ashley Nicole Blackwell

(57) ABSTRACT

The present application provides a display panel and a display device, the display panel includes a first display area and a second display area, wherein a light emitting layer of the display panel includes a plurality of first pixels disposed in the first display area and a plurality of second pixels disposed in the second display area, and in the first display area, a first opening is provided between a second electrode layer and adjacent first pixels, so as to improve a light transmittance of the first display area, and alleviate a problem of a poor light transmittance of a display screen in which a conventional under-screen camera technology is applied.

11 Claims, 7 Drawing Sheets

(58) Field of Classification Search
CPC ....... H10K 59/80515; H10K 59/80521; H10K 59/65; H01L 27/3244; H01L 27/3272; H01L 27/3234
See application file for complete search history.

(56) References Cited

U.S. PATENT DOCUMENTS

2021/0305339 A1    9/2021   Li
2021/0408194 A1*  12/2021   Zhang ................ H10K 59/126

FOREIGN PATENT DOCUMENTS

| | | |
|---|---|---|
| CN | 110211975 | 9/2019 |
| CN | 110660835 | 1/2020 |
| CN | 110783381 | 2/2020 |
| CN | 110808267 | 2/2020 |
| CN | 111009619 | 4/2020 |
| CN | 111129092 A * | 5/2020 ........... H01L 27/322 |
| CN | 111129102 | 5/2020 |
| CN | 111370411 | 7/2020 |
| CN | 111384284 | 7/2020 |
| CN | 111708195 | 9/2020 |
| CN | 111710707 | 9/2020 |
| CN | 111882995 | 11/2020 |
| CN | 111933660 | 11/2020 |
| CN | 112992712 | 11/2020 |
| CN | 112864210 | 5/2021 |
| CN | 113327934 | 8/2021 |
| CN | 214043706 | 8/2021 |
| CN | 113394245 | 9/2021 |
| CN | 113629208 | 11/2021 |
| CN | 113725272 | 11/2021 |
| CN | 113823665 | 12/2021 |
| JP | 2009-111047 | 5/2009 |
| WO | WO 2012/001740 | 1/2012 |

OTHER PUBLICATIONS

Notification of Office Action and Search Report Dated Mar. 31, 2023 From the State Intellectual Property Office of the People's Republic of China Re. Application No. 202210115902.4 and Its Translation Into English. (23 Pages).

* cited by examiner

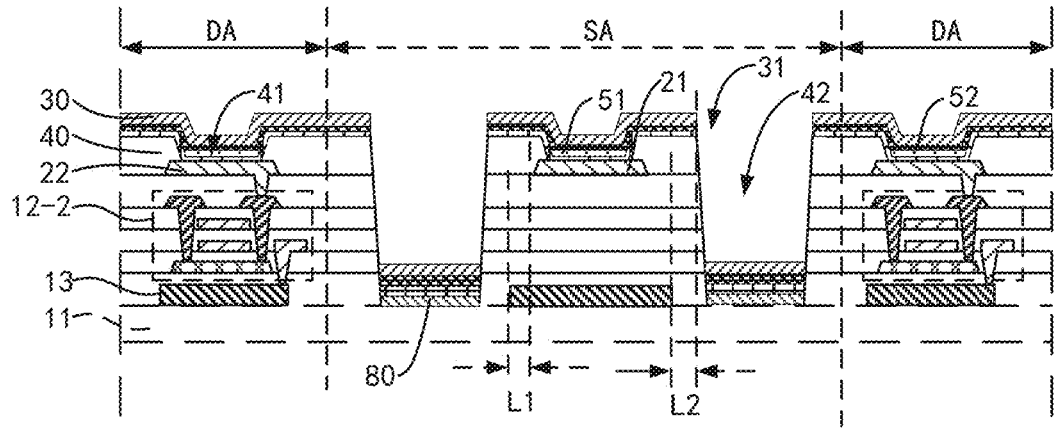

FIG. 11 preparing a drive substrate divided into a first display area and a second display area, wherein a light transmittance of the first display area is greater than a light transmittance of the second display area —— 301 preparing a first electrode layer on a side of the drive substrate, and patterning the first electrode layer —— 302 preparing a light emitting layer on a side of the first electrode layer away from the drive substrate, wherein the light emitting layer includes a plurality of first pixels disposed in the first display area and a plurality of second pixels disposed in the second display area —— 303 preparing a second electrode layer on a side of the light emitting layer away from the first electrode layer, patterning the second electrode layer so that the second electrode layer forms a first opening between adjacent first pixels in the first display area, wherein center points of a plurality of adjacent first pixels around the first opening define a first polygon, and a ratio of an area of the first opening to an area of a corresponding first polygon ranges from 50% to 95% —— 304

FIG. 12

DISPLAY PANEL AND DISPLAY DEVICE

RELATED APPLICATIONS

This application is a National Phase of PCT Patent Application No. PCT/CN2022/076165 having International filing date of Feb. 14, 2022, which claims the benefit of priority of Chinese Patent Application No. 202210115902.4 filed on Feb. 7, 2022. The contents of the above applications are all incorporated by reference as if fully set forth herein in their entirety.

FIELD AND BACKGROUND OF THE INVENTION

The present application relates to a technical field of display, and in particular to a display panel and a display device.

With an increasing demand for mobile phone screens, full display screens have become an inevitable trend. However, some internal components, such as a front-facing camera of a mobile phone, a facial recognition sensor, etc., occupy a screen display area, resulting in a lack of a display screen, and a real full screen cannot be realized. The problem is alleviated by a presence of camera under panel (CUP) technology, which can display and image in the CUP area without drilling holes. However, light transmittance effect of the display screen, to which the CUP technology is currently applied, is generally such that it affects the imaging effect of an under-screen camera.

Therefore, there exists a technical problem of poor light transmittance in the display screen in which an under-screen camera technology is used.

The present application provides a display panel and a display device to alleviate a technical problem of poor light transmittance of a display screen in which an under-screen camera technology is used.

SUMMARY OF THE INVENTION

To solve the above problems, the present application provides the following technical solutions:

An embodiment of the present application provides a display panel comprising a first display area and a second display area, wherein a light transmittance of the first display area is greater than a light transmittance of the second display area, and the display panel further comprises:
  a drive substrate;
  a first electrode layer located on a side of the drive substrate;
  a light emitting layer located on a side of the first electrode layer away from the drive substrate, wherein the light emitting layer comprises a plurality of first pixels disposed in the first display area and a plurality of second pixels disposed in the second display area; and
  a second electrode layer located on a side of the light emitting layer away from the first electrode layer;
  wherein in the first display area, the second electrode layer is provided with a first opening between adjacent first pixels of the plurality of first pixels, center points of a plurality of adjacent first pixels around the first opening define a first polygon, and a ratio of an area of the first opening to an area of a corresponding first polygon ranges from 50% to 95%.

In the display panel provided in the embodiment of the present application, the first electrode layer comprises a plurality of first electrode blocks corresponding to the plurality of first pixels and a plurality of second electrode blocks corresponding to the plurality of second pixels;
  center points of a plurality of adjacent first electrode blocks of the plurality of the first electrode blocks around the first opening define a second polygon, and a ratio of the area of the first opening to an area of a corresponding second polygon ranges from 50% to 95%.

In the display panel provided by the present embodiment, the drive substrate includes:
  a substrate;
  a drive circuit layer disposed between the substrate and the light emitting layer, wherein the drive circuit layer comprises a plurality of first transistors corresponding to the plurality of first pixels and a plurality of second transistors corresponding to the plurality of second pixels;
  a light shielding layer disposed between the substrate and the drive circuit layer, wherein the light shielding layer comprises a plurality of first light shielding portions disposed corresponding to the plurality of first pixels;
  wherein center points of a plurality of adjacent first light shielding portions of the plurality of the first light shielding portions around the first opening define a third polygon, and a ratio of the area of the first opening to an area of a corresponding third polygon ranges from 50% to 95%.

In the display panel provided in the embodiment of the present application, the driver circuit layer further comprises a plurality of first signal traces electrically connected to the plurality of first transistors;
  the light shielding layer further comprises a plurality of second light shielding portions disposed in the first display area and overlapped with the plurality of first signal traces, and each of the plurality of second light shielding portions is electrically connected between the adjacent first light shielding portions.

In the display panel provided in the embodiment of the present application, the first display area comprises a translucent sub-area, and a transition sub-area between the translucent sub-area and the second display area;
  the light shielding layer further comprises a third light shielding portion disposed around the plurality of first light shielding portions and the plurality of second light shielding portions, the third light shielding portion and the transition sub-area at least partially overlap, and each of the plurality of second light shielding portions is further connected between the third light shielding portion and the plurality of first light-shielding portions adjacent to the third light shielding portion.

In the display panel provided in the embodiment of the present application, the first opening is provided corresponding to an area defined by the plurality of first light shielding portions and the plurality of second light shielding portions adjacent to each other, or corresponding to an area defined by the plurality of first light shielding portions, the plurality of second light shielding portions, and the third light shielding portion adjacent to each other.

In the display panel provided in the embodiment of the present application, an edge of at least one of the plurality of first light shielding portions, the plurality of second light shielding portions, and the third light shielding portion has a wave shape or a zigzag shape.

In the display panel provided in the embodiment of the present application, a number of the plurality of first pixels in a unit area is same as a number of the plurality of second pixels in a unit area.

In the display panel provided in the embodiment of the present application, the first display area comprises a translucent sub-area, and a transition sub-area between the translucent sub-area and the second display area;

the plurality of first transistors are disposed in the transition sub-area, or the plurality of first transistors are disposed in the translucent sub-area and between the plurality of first light shielding portions and the plurality of first pixels.

In the display panel provided in the embodiment of the present application, the light emitting layer is provided with a second opening in the first display area corresponding to the first opening, center points of the plurality of adjacent first pixels around the second opening define the first polygon, and a ratio of an area of the second opening to an area of the corresponding first polygon ranges from 50% to 95%.

In the display panel provided by the present embodiment, the drive substrate includes:
a substrate;
a light shielding layer disposed on a side of the substrate;
a drive circuit layer disposed between the light shielding layer and the light emitting layer;
a pixel definition layer disposed between the drive circuit layer and the light emitting layer;
wherein the drive substrate is provided with a third opening corresponding to the first opening, and the third opening extends through at least the pixel definition layer.

In the display panel provided in the embodiment of the present application, the light shielding layer comprises a plurality of first light shielding portions provided corresponding to the plurality of first pixels;
a bottom surface of the third opening extends to the light shielding layer and is located on a same layer as a bottom surface of the plurality of first light shielding portions.

In the display panel provided by the present embodiment, a minimum distance between the first opening and the plurality of first pixels adjacent to the first opening is greater than or equal to 2 μm.

An embodiment of the present application further provides a display device including a functional element disposed on a non-light-emitting side of a first display area of the display panel, and a display panel of one of the above embodiments.

In a display panel and a display device provided in the present application, the display panel includes a first display area and a second display area, a light transmittance of the first display area is greater than that a light transmittance of the second display area, the display panel further includes a drive substrate, a first electrode layer located on a side of the drive substrate, a light emitting layer located on a side of the first electrode layer away from the drive substrate, and a second electrode layer located on a side of the light emitting layer away from the first electrode layer. The light emitting layer includes a plurality of first pixels disposed in the first display area and a plurality of second pixels disposed in the second display area, wherein the second electrode layer is provided with a first opening between adjacent first pixels of the plurality of first pixels in the first display area, center points of the plurality of adjacent first pixels around the first opening define a first polygon, and a ratio of an area of the first opening to an area of a corresponding first polygon ranges from 50% to 95%. In the present application, the second electrode layer is provided with a first opening between adjacent first pixels corresponding to the first display area, so as to improve a light transmittance of the first display area, thereby solving a problem of a poor light transmittance of a display screen in which a conventional under-screen camera technology is applied.

BRIEF DESCRIPTION OF THE SEVERAL VIEWS OF THE DRAWINGS

In order to more clearly illustrate the embodiments or prior art solutions, the accompanying drawings required for use in the description of the embodiments or prior art will be briefly described below. It will be apparent that the accompanying drawings in the following description are merely some embodiments of the invention, and other drawings may be obtained from these drawings without creative effort by one of ordinary skill in the art.

FIG. 11 is another cross-sectional structural schematic diagram before patterning the second electrode layer according to an embodiment of the present application.

FIG. 12 is a flow chart of a display panel preparation method according to an embodiment of the present application.

DESCRIPTION SPECIFIC EMBODIMENTS OF THE INVENTION

Figure 1:
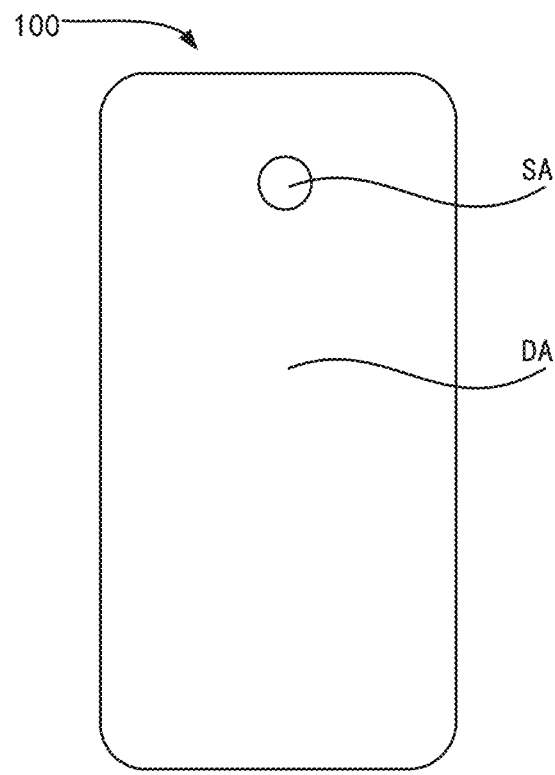
FIG. 1 is a top view structural schematic diagram of a display panel according to an embodiment of the present application.

The following embodiments are described with reference to additional illustrations to illustrate specific embodiments that may be implemented by the present application. The direction terms mentioned in the present application, such as [upper], [lower], [front], [rear], [left], [right], [inner], [outer], [side], and the like, refer only to the directions of the accompanying drawings. Therefore, the direction terms used are intended to illustrate and understand the present application and are not intended to limit the present application. In the figures, elements of similar structure are denoted by the same reference numerals. In the drawings, the thicknesses of some layers and area are exaggerated for clarity of understanding and ease of description. That is, the dimensions and thickness of each assembly shown in the drawings are arbitrarily shown, but the present application is not limited thereto.

Figure 2:
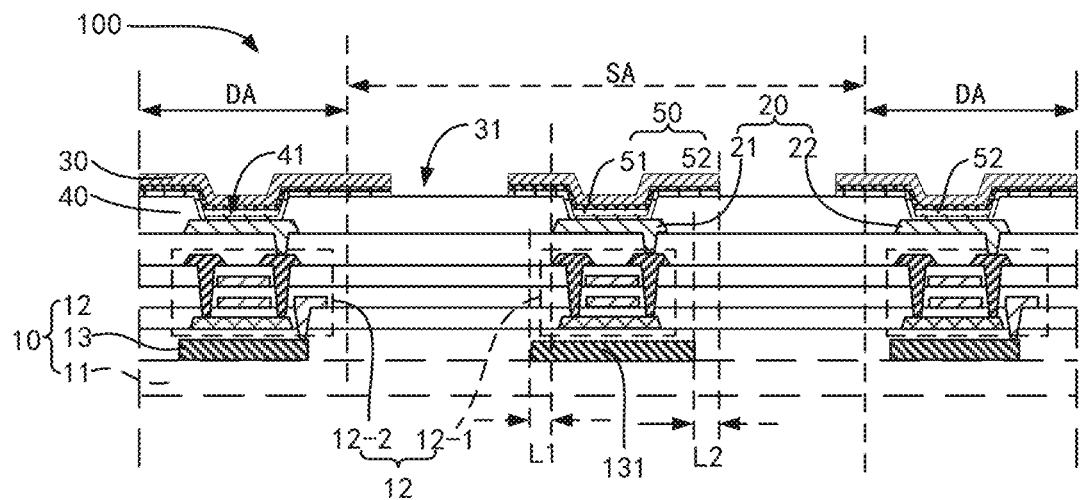
FIG. 2 is a cross-sectional structural schematic diagram of a display panel according to an embodiment of the present application.
Figure 3:
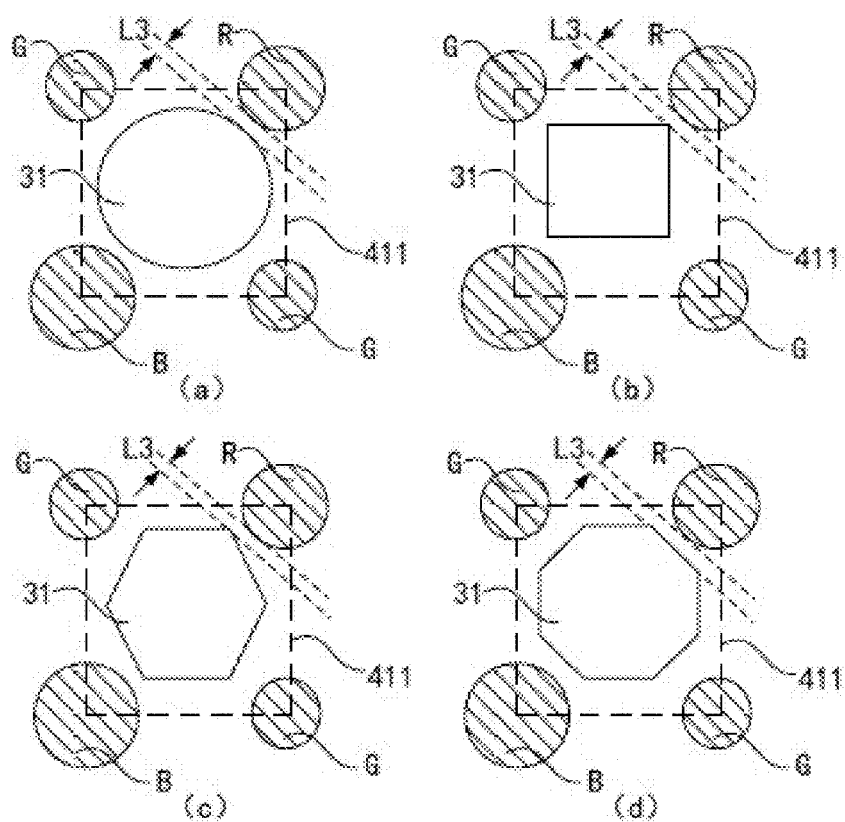
FIG. 3 is a schematic diagram of a surface shape of a first opening according to an embodiment of the present application.
Figure 4:
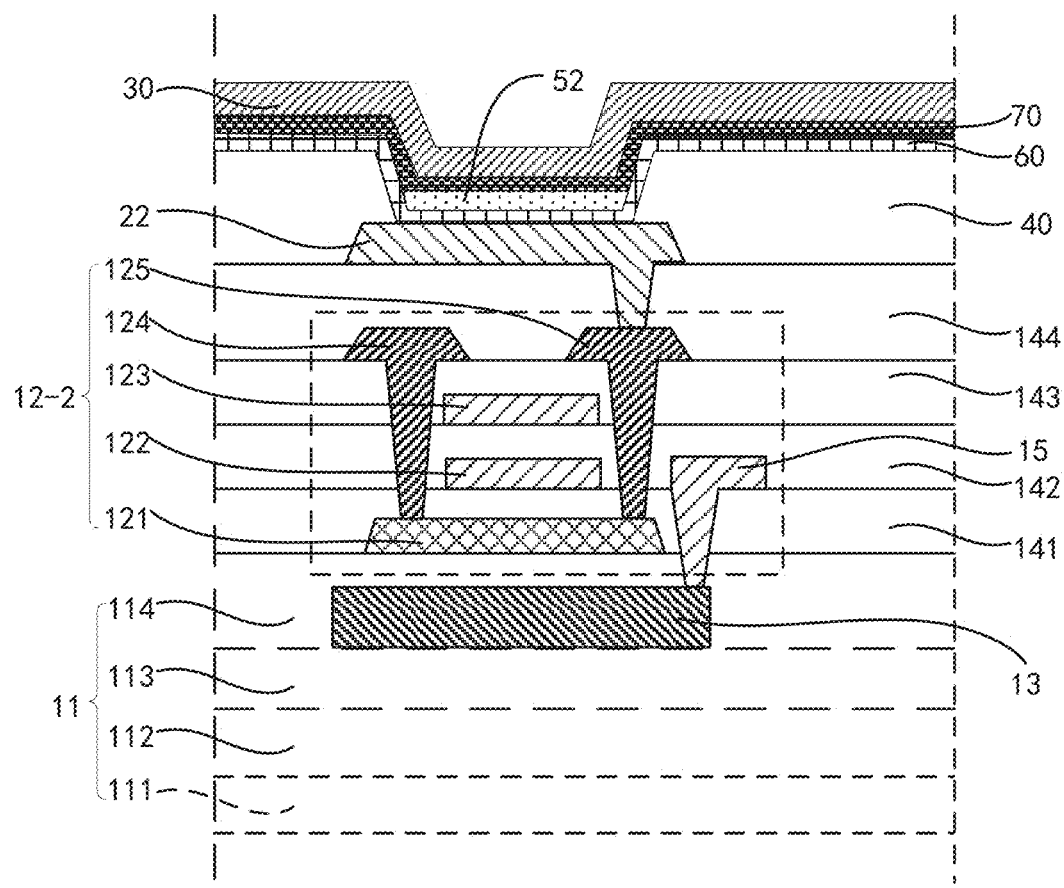
FIG. 4 is a detailed structural diagram of a drive substrate according to an embodiment of the present application.
Figure 5:
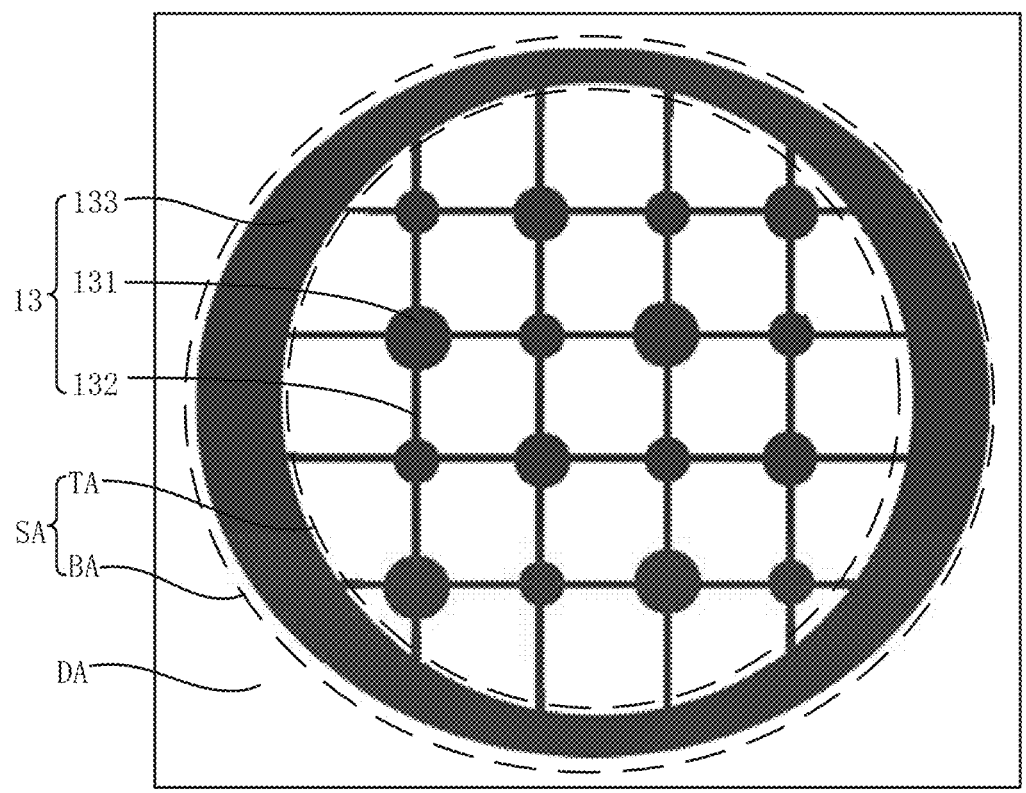
FIG. 5 is a top view structural schematic diagram of a light shielding layer in a first display area according to an embodiment of the present application.
Figure 6:
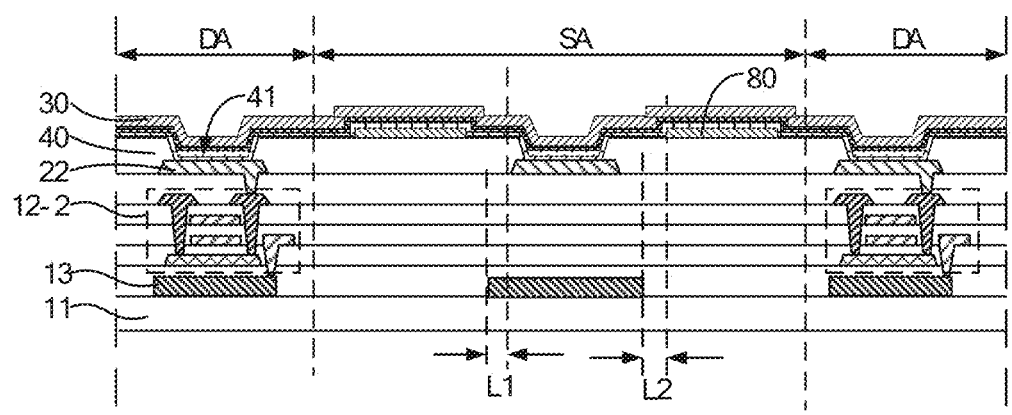
FIG. 6 is a cross-sectional structural schematic diagram before patterning a second electrode layer according to an embodiment of the present application.

Referring to FIGS. 1 to 4, FIG. 1 is a top view structural schematic diagram of a display panel according to an embodiment of the present application. FIG. 2 is a cross-sectional structural schematic diagram of a display panel according to an embodiment of the present application. FIG. 3 is a schematic diagram of a surface shape of a first opening according to an embodiment of the present application. FIG. 4 is a detailed structural diagram of a drive substrate according to an embodiment of the present application. The display panel 100 includes a first display area SA and a second display area DA, wherein a light transmittance of the first display area SA is greater than a light transmittance of the second display area DA. The first display area SA is a function addition area. The first display area SA can be used to display an image so that the display panel 100 can display a full-screen display effect, and can be used to install optical elements such as a camera, an optical touch assembly, and a fingerprint recognition sensor, thereby improving user experience. The second display area DA is a main display area, and the second display area DA is used to display an image.

The display panel 100 further includes a drive substrate 10, a first electrode layer 20 on a side of the drive substrate 10, a light emitting layer 50 on a side of the first electrode layer 20 away from the drive substrate 10, and a second electrode layer 30 on a side of the light emitting layer 50 away from the first electrode layer 20. The light emitting layer 50 includes a plurality of first pixels 51 disposed in the first display area SA, and a plurality of second pixels 52 disposed in the second display area DA.

Optionally, a number of the first pixels 51 in a unit area is same as a number of the second pixels 52 in a unit area, that is, a pixel density of the first display area SA is equal to a pixel density of the second display area DA to reduce a display difference between the first display area SA and the second display area DA. A size and a shape of each of the first pixels 51 in the first display area SA may be same as or different from a size and a shape of each of the second pixels 52 in the second display area DA. Wherein each of the first pixels 51 and the second pixels 52 has a shape including a circular shape, a square shape, and other polygons. The present embodiment is described with reference to a circular shape.

The plurality of first pixels 51 and the plurality of second pixels 52 include a red sub-pixel, a green sub-pixel, a blue sub-pixel, and other color sub-pixels, wherein each of the first pixels 51 and each of the second pixels 52 is one of a red sub-pixel, a green sub-pixel, and a blue sub-pixel. The red sub-pixel is formed of a red-light emitting material, and emits a red light; The green sub-pixel is formed of a green-light emitting material, and emits a green light; the blue sub-pixel is formed of a blue-light emitting material, and emits a blue light.

It is understood that the first pixels 51 and the second pixels 52 emit light under a joint action of the first electrode layer 20 and the second electrode layer 30. The first electrode layer 20 is an anode, and the second electrode layer 30 is a cathode. Of course, the present application is not limited thereto. The first electrode layer 20 may be a cathode, and the second electrode layer 30 is an anode.

Wherein in the first display area SA, the second electrode layer 30 is defined with a first opening 31 between adjacent first pixels 51 of the plurality of first pixels 51 to increase the light transmittance of the first display area SA. Center points of a plurality of adjacent first pixels 51 around the first opening 31 define a first polygon 411, and a ratio of an area of the first opening 31 to an area of the corresponding first polygon 411 ranges from 50% to 95%, so as to increase a light transmittance of the first display area SA while reducing an influence on an electrical performance of the second electrode layer 30.

The light emitting layer 50 is defined with a second opening corresponding to the first opening 31 in the first display area SA, and center points of a plurality of adjacent first pixels 51 around the second opening define the first polygon 411, and a ratio of an area of the second opening to an area of the corresponding first polygon 411 ranges from 50% to 95%.

Optionally, the first polygon 411 is quadrangular, and the plurality of first pixels 51 defining the first polygon 411 include at least three color sub-pixels, such as one blue sub-pixel B, one red sub-pixel R, and two green sub-pixels G. As shown in FIG. 3, a size of the blue sub-pixel B is greater than a size of the red sub-pixel R, and a size of the red sub-pixel R is greater than a size of the green sub-pixel G.

The first electrode layer 20 includes a plurality of electrode blocks arranged in an array on the drive substrate 10, each of the electrode blocks corresponding to one sub-pixel. Specifically, the first electrode layer 20 includes a plurality of first electrode blocks 21 corresponding to the first pixel 51 and a plurality of second electrode blocks 22 corresponding to the second pixel 52. Center points of a plurality of adjacent first electrode blocks 21 of the plurality of first electrode blocks 21 around the first opening 31 define a second polygon, and a ratio of an area of the first opening 31 to an area of a corresponding second polygon ranges from 50% to 95%.

It is understood that the light emitting layer 50 is disposed on the first electrode layer 20, specifically, the first pixel 51 is disposed on the first electrode block 21 and the second pixel 52 is disposed on the second electrode block 22. An orthographic projection of the first pixel 51 on the drive substrate 10 is within an orthographic projection of the first electrode block 21 on the drive substrate 10, and an area of the first pixel 51 is smaller than an area of the first electrode block 21. An orthographic projection of the second pixel 52 on the drive substrate 10 is within an orthographic projection of the second electrode block 22 on the drive substrate 10, and an area of the second pixel 52 is smaller than an area of the second electrode block 22. A center point of the first electrode block 21 coincides with a center point of the corresponding first pixel 51, and a center point of the second electrode block 22 coincides with a center point of the corresponding second pixel 52. In this way, a second polygon defined by center points of the plurality of adjacent first electrode blocks 21 around the first opening 31 coincides with the first polygon 411 defined by center points of the plurality of first pixels 51 corresponding to the plurality of first electrode blocks 21.

Further, an orthographic projection of the first opening 31 on the drive substrate 10 is separated from the orthographic projection of the first electrode block 21 on the drive substrate 10. In the present application, "separated from" means that orthographic projections of the two components on a same plane do not overlap each other and have a spacing therebetween, for example, the orthographic projection of the first opening 31 on the drive substrate 10 is separated from the orthographic projection of the first electrode block 21 on the drive substrate 10, that is, the orthographic projection of the first opening 31 on the drive substrate 10 and the orthographic projection of the first electrode block 21 on the drive substrate 10 do not overlap each other, and the orthographic projection of the first opening 31 on the drive substrate 10 and the orthographic projection of the first electrode block 21 on the drive substrate 10 have a spacing therebetween.

Further, a minimum distance L3 between the first opening 31 and the adjacent first pixel 51 is greater than or equal to 2 μm, that is, a minimum distance L3 between and the orthographic projection of the first opening 31 on the drive substrate 10 and the orthographic projection of the first electrode block 21 on the drive substrate 10 is greater than or equal to 2 μm. As such, the orthographic projection of the second electrode layer on the drive substrate 10 completely covers the orthographic projection of each of the first electrode blocks 21 on the drive substrate 10 to ensure a normal display of each of the first pixels 51 within the first display area SA. Optionally, a surface shape of the first opening 31 includes a circular shape, a square shape, a hexagonal shape, an octagon shape, and the like. The surface shape of the first opening 31 shown in (a) in FIG. 3 is a circular shape, the surface shape of the first opening 31 shown in (b) in FIG. 3 is a square shape, the surface shape of the first opening 31 shown in (c) in FIG. 3 is a regular hexagonal shape, and the surface shape of the first opening 31 shown in (d) in FIG. 3 is a regular octagon shape.

The specific structure of the drive substrate 10 will be described in detail below.

Optionally, referring to FIG. 4, the drive substrate 10 includes a substrate 11, a drive circuit layer 12 disposed between the substrate 11 and the light emitting layer 50, and a light shielding layer 13 disposed between the substrate 11 and the drive circuit layer 12.

Optionally, the substrate 11 may be a flexible substrate, and a material of the flexible substrate may be an organic material such as polyimide. The substrate 11 may also be a rigid substrate, and a material of the rigid substrate may be, for example, glass, metal, plastic, or the like. The substrate 11 may be a single-layer film layer structure or a multi-layer film layer structure, for example, when the substrate 11 is a flexible polyimide substrate, the substrate 11 may include a first substrate 111, a first barrier layer 112, a second substrate 113, and a second barrier layer 114 which are laminated, wherein the first barrier layer 112 and the second barrier layer 114 are used to block the permeation of water and oxygen through the substrate 11, and materials of the first barrier layer 112 and the second barrier layer 114 include inorganic materials such as silicon oxide, silicon nitride, and the like.

The light shielding layer 13 may be located on the substrate 11, specifically, the light shielding layer 13 may be located between the first substrate 111 and the first barrier layer 112, or the light shielding layer 13 may be located between the second substrate 113 and the second barrier layer 114. In this embodiment, the light shielding layer 13 is located between the second substrate 113 and the second barrier layer 114.

Specifically, the drive circuit layer 12 is disposed between the light shielding layer 12 and the light emitting layer 50. The drive circuit layer 12 includes a plurality of first transistors 12-1 corresponding to the plurality of first pixel 51, and a plurality of second transistors 12-2 corresponding to the plurality of second pixels 52. The first transistor 12-1 is electrically connected to the corresponding first electrode block 21, and the second transistor 12-2 is electrically connected to the corresponding second electrode block 22.

Specifically, taking the second transistor 12-2 as an example, the second transistor 12-2 is located on a side of the second barrier layer 114 away from the light shielding layer 13. The second transistor 12-2 includes an active layer 121, a first gate electrode 122 and a second gate electrode 123 disposed on a side of the active layer 121 away from the light shielding layer 13, a source electrode 124 and a drain electrode 125 disposed on a side of the second gate electrode 123 away from the first gate electrode 122. The active layer 121 includes a channel area, a source area and a drain area disposed on both sides of the channel area, wherein the first gate electrode 122 and the second gate electrode 123 are disposed corresponding to the channel area, the source electrode 124 is connected to the source area of the active layer 121, the drain electrode 125 is connected to the drain area of the active layer 121, and the second electrode block 22 is connected to the source electrode 124 or the drain electrode 125. However, the present application is not limited here, and a structure of the second transistor 12-2 of the present application may be of another type, such as a single gate, a bottom gate, or the like. For the structure description of the first transistor 12-1, refer to the second transistor 12-2, which will not be repeated here.

Certainly, the drive substrate 10 further includes an insulating layer disposed between the respective layers of the drive circuit layer 12, such as a first gate insulating layer 141 disposed between the active layer 121 and the first gate electrode 122, a second gate insulating layer 142 disposed between the first gate electrode 122 and the second gate electrode 123, an interlayer insulating layer 143 disposed between the second gate electrode 123 and the source electrode 124, and a planarization layer 144 disposed between the source electrode 124 and the first electrode layer 20 and between the drain electrode 125 and the first electrode layer 20.

Optionally, the drive circuit layer 12 further includes a second signal trace 15 connected to the light shielding layer 13, and by connecting the light shielding layer 13 to the second signal trace 15, damage to the pixel circuit caused by electrostatic discharge is prevented or reduced. The second signal line 15 includes a constant voltage signal line such as VDD. The second signal line 15 may be disposed in a same layer as the first gate electrode 122 or the second gate electrode 123, or may be disposed in a same layer as the active electrode or the drain electrode 125, but the present application is not limited thereto. Of course, the drive substrate 10 further includes signal lines such as a data line and a gate scanning line, which will not be repeated here.

The light shielding layer 13 is disposed between the substrate 11 and the drive circuit layer 12 to shield the transistor of the drive circuit layer 12 from light shining on the transistor. Further, in the first display area SA, the light shielding layer 13 includes a plurality of first light shielding portions 131 provided corresponding to the first pixel 51. Center points of a plurality of adjacent first light shielding portions 131 of the plurality of first light shielding portions 131 around the first opening 31 define a third polygon, and a ratio of an area of the first opening 31 to an area of the corresponding third polygon ranges from 50% to 95%. It is understood that the first light shielding portion 131 is disposed corresponding to the first pixel 51, the orthographic projection of the first pixel 51 on the substrate 11 is within a range of the orthographic projection of the first light shielding portion 131 on the substrate 11, an area of the first pixel 51 is smaller than an area of the first light shielding portion 131, and a center point of the first pixel 51 coincides with a center point of the first light shielding portion 131. As such, the third polygon defined by center points of a plurality of adjacent first light shielding portions 131 around the first opening 31 coincides with the first polygon 411 defined by center points of the plurality of first pixels 51 corresponding to the plurality of first light shielding portions 131.

More specifically, a minimum distance L2 between an outer contour of the first opening 31 orthogonally projected on the substrate 11 and an outer contour of the first light shielding portion 131 orthogonally projected on the substrate 11 is greater than 1 μm, that is, the orthographic projection of the first opening 31 on the substrate 11 is separated from the orthographic projection of the first light shielding portion 131 on the substrate 11.

In an embodiment, in order to further improve the light transmittance of the first display area SA, the first transistor 12-1 may also be disposed within the first display area SA at an edge of the first display area SA. Specifically, the first display area SA includes a translucent sub-area TA and a transition sub-area BA between the translucent sub-area TA and the second display area DA, and the first transistor 12-1 is located within the transition sub-area BA to further improve the transmittance of the first display area SA. For this purpose, the driving circuit layer 12 further comprises a plurality of first signal traces electrically connected to the plurality of first transistors 12-1, the first transistor 12-1 is connected to the corresponding first electrode block 21 by the first signal trace, and the first signal trace is a transparent conducting line.

In addition, referring to FIGS. 1 to 5, FIG. 5 is a top view structural schematic diagram of a light shielding layer in a first display area according to an embodiment of the present application. In order to protect the first signal trace, the light shielding layer 13 further includes a plurality of second light shielding portions 132 disposed in the first display area SA and overlap the first signal trace, and the second light shielding portion 132 is electrically connected to an adjacent first light shielding portion 131. An orthographic projection of the second light shielding portion 132 on the substrate 11 covers an orthographic projection of the first signal trace on the substrate 11, and a minimum distance between an outer contour of the orthographic projection of the second light shielding portion 132 on the substrate 11 and an outer contour of the orthographic projection of the first signal trace on the substrate 11 is greater than 1 μm.

It is understood that in order to protect the first electrode block 21, an orthographic projection of the first light shielding portion 131 on the substrate 11 covers the orthographic projection of the first electrode block 21 on the substrate 11, and a minimum distance L1 between an outer contour of the orthographic projection of the first light shielding portion 131 on the substrate 11 and an outer contour of the orthographic projection of the first electrode block 21 on the substrate 11 is greater than 1 μm. Of course, in the second display area DA, the light shielding layer 13 may be designed in an entire surface or the light shielding layer 13 may be disposed corresponding to the second electrode block 22, so that the second transistor 10-2 can be shielded.

Further, in order to shield the first transistor 20-1 located in the transition sub-area BA of the first display area SA, the light shielding layer 13 further includes a third light shielding portion 133 provided around the first light shielding portion 131 and the second light shielding portion 132, the third light shielding portion 133 is at least partially overlapped with the transition sub-area BA, and the second light shielding portion 132 is further connected between the third light shielding portion 133 and the first light shielding portions 131 adjacent to the third light shielding portion 133.

Optionally, a surface shape of the third light shielding portion 133 is an elliptical ring, and a minimum width of the third light shielding portion 133 is greater than 10 μm to protect the first transistor 20-1 located in the transition sub-area BA from damage. The first opening 31 is disposed corresponding to an area defined by the first light shielding portion 131 and the second light shielding portion 132 adjacent to each other, and/or disposed corresponding to an area defined by the first light shielding portion 131, the second light shielding portion 132, and the third light shielding portion 133 adjacent to each other.

How to form a first opening 31 to increase the light transmittance of the first display area SA will be described in detail below.

Referring to FIGS. 1 to 6, FIG. 6 is a cross-sectional structural schematic diagram of a second electrode layer before patterning. In order to pattern the second electrode layer 30 to form the first opening 31, a sacrificial layer 80 may be disposed between adjacent first pixels 51 within the first display area SA, and the second electrode layer 30 is disposed on the sacrificial layer 80. Then the sacrificial layer 80 is stripped by laser, and the second electrode layer 30 is partially stripped, so as to form the first opening 31.

Specifically, the display panel 100 further includes a pixel definition layer 40 on the first electrode layer 20 and the drive substrate 10, and specifically, the pixel definition layer 40 is overlaid on the first electrode layer 20 and the planarization layer 144. A pixel opening 41 is disposed on the pixel definition layer 40, the pixel opening 41 is disposed corresponding to an electrode block (e.g., the first electrode block 21 and the second electrode block 22) of the first electrode layer 20, and a corresponding portion of the electrode block is exposed.

Optionally, the sacrificial layer 80 is disposed on the pixel definition layer 40 within the first display area SA, and an orthographic projection of the sacrificial layer 80 on the drive substrate 10 is separated from an orthographic projection of the light shielding layer 13 on the drive substrate 10. A thickness of the sacrificial layer 80 is less than a thickness of the light shielding layer 13. For example, the thickness of the light shielding layer 13 ranges from 500 angstroms to 5000 angstroms, and the thickness of the sacrificial layer 80 ranges from 100 angstroms to 2000 angstroms. A material of the sacrificial layer 80 and a material of the light shielding layer 13 may be same or different. For example, the material of the light shielding layer 13 includes at least one of metals such as Al, Pt, Pd, Ag, Mo, Li, and W; and the material of the sacrificial layer 80 also includes at least one of metals such as Al, Pt, Pd, Ag, Mo, Li, and W.

Further optionally, in order to improve an efficiency of the electron and electron hole injecting into light emitting layer 50, the display panel 100 may further include a first functional film layer 60 between the first electrode layer 20 and the light emitting layer 50, and a second functional film layer 70 between the light emitting layer 50 and the second electrode layer 30. Wherein the first functional film layer 60 may be an electron hole transport layer, or a composite film layer of an electron hole transport layer and an electron hole injection layer, in which the electron hole injection layer is between the electron hole transport layer and the light emitting layer 50. The second functional film layer 70 may be an electron transport layer, or a composite film layer of an electron transport layer and an electron injection layer, in which the electron injection layer is between the electron transport layer and the light emitting layer 50. Thus, the first functional film layer 60 and the second functional film layer 70 are further sandwiched between the sacrificial layer 80 and the second electrode layer 30. Of course, the display panel 100 may further include an encapsulation layer or the like located on a side of the second electrode layer 30 away from the first electrode layer 20, the encapsulation can protect the light-emitting layer 50 from failure of the light-emitting material caused by an invasion of water and oxygen.

Figure 7:
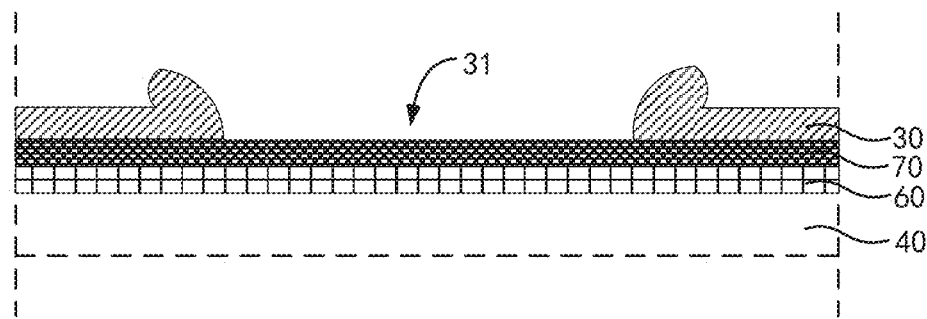
FIG. 7 is a detailed structural diagram of the first opening according to an embodiment of the present application.

It can be understood, since the thickness of the sacrificial layer 80 is less than the thickness of the light shielding layer 13, and the orthographic projection of the sacrificial layer 80 on the drive substrate 10 is separated from the orthographic projection of the light shielding layer 13 on the drive substrate 10, the sacrificial layer 80 absorbs energy to lift the film layer including the second electrode layer 30 immediately above the sacrificial layer 80 during laser processing, thereby forming the first opening 31 having a crater-like structure with a narrow bottom and a wide top, as shown in FIG. 7, which is a detailed structural diagram of the first opening provided in the embodiment of the present application.

Specifically, during the laser processing, since the surface shape of the third light shielding portion 133 is an elliptical ring covering a wiring edge, where the wiring edge refers to an area where the first transistor 12-1 of the first display area SA is disposed, and considering an effect of laser edge energy attenuation, a minimum width of the elliptical ring needs to be guaranteed to be over 10 µm, and an inner edge of the elliptical ring exceeds the edge wiring over 1 µm. In this way, during laser patterning of the second electrode layer 30, the third light shielding portion 133 can protect the first transistor 12, and can also prevent a risk that the second electrode layer 30 at an edge cannot be effectively removed due to the laser edge energy attenuation.

Further, the second light shielding portion 132 has a same shape as the first signal trace, a width of the second light shielding portion 132 is at least 2 mm wider than a width of the first signal trace, and a minimum distance between an outer contour of an orthography projection of the second light shielding portion 132 on the substrate 11 and an outer contour of an orthography projection of the first signal trace on the substrate 11 is greater than 1 µm. As such, during laser patterning of the second electrode layer 30, the second light shielding portion 132 can function as protecting the first signal trace.

Similarly, the first light shielding portion 131 is disposed corresponding to the first electrode block 21, an orthographic projection of the first light shielding portion 131 on the substrate 11 covers an orthographic projection of the first electrode block 21 on the substrate 11, and a minimum distance between an outer contour of the orthographic projection of the first light shielding portion 131 on the substrate 11 and an outer contour of the orthographic projection of the first electrode block 21 on the substrate 11 is greater than 1 µm. As such, during laser patterning of the second electrode layer 30, the first light shielding portion 131 can function as protecting the first electrode block 21.

Therefore, when the first display area SA is irradiated with an infrared laser light from a back side of the display panel 100, that is, from below the substrate 11; the first electrode block 21, the first signal trace, and the first transistor 20-1 are shielded by the light shielding layer 13, and the film layers below the second electrode layer 30 (including the substrate 11, the insulating layer, the light emitting layer, and the like) hardly absorbs the infrared light (a transmittance of which is 90-100%). Therefore, an area of the sacrificial layer 80 not shielded by the light shielding layer 13 absorbs the infrared laser, and a temperature of the irradiated area is increased by thermal diffusion and heat transfer, so that changes such as melting and vaporization occur, and the second electrode layer 30 corresponding to the sacrificial layer 80 is peeled off to form the first opening 31.

It should be noted that energy and depth of field of the laser affect a depth of peeling. When the laser energy is too low, the peeling is not complete, and a portion of the second electrode layer 30 is remained on the irradiation area of the laser, which affects a transmittance of the first display area SA. When the laser energy is too high, although the second electrode layer 30 in the irradiated area is peeled off effectively, an excessive energy can damage the film layers below the second electrode layer 30, such as the first functional film layer 60 and the second functional film layer 70. At the same time, a thermal effect due to the excessive energy causes edges to curl over a large area and even tear away most of the film layers, thereby affecting the second electrode layer 30 in an area which is not irradiated, resulting in subsequent encapsulation failure and display abnormalities.

Therefore, it is necessary to select an appropriate laser energy to peel off the second electrode layer 30 in the irradiated area completely without damaging the film layers below the second electrode layer 30, so that an edge of the first opening 31 formed is smooth and free from abnormal protrusions and tears, wherein the absence of abnormal protrusions means that a protrusion formed by the second electrode layer near the first opening 31 is less than 1 µm in height, so as not to affect encapsulation by the encapsulation layer and protect effective encapsulation by the encapsulation layer. In addition, an area ratio of a laser peeling area in the first display area SA is 70%~90%, and a transmittance of a corresponding first display area SA can be increased by 30%~60%.

Figure 8:
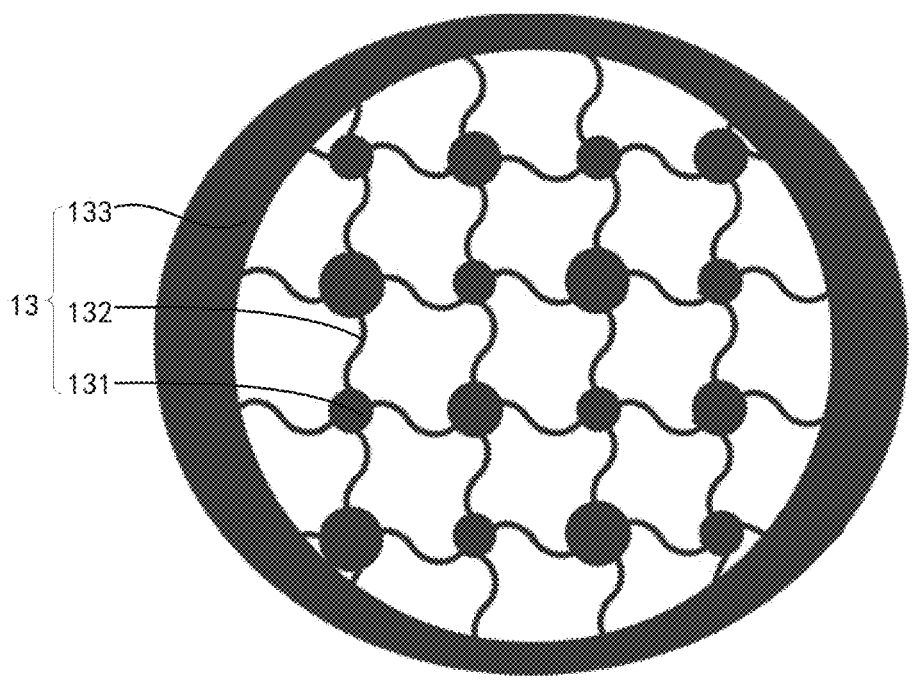
FIG. 8 is another top view structural schematic diagram of the light shielding layer according to an embodiment of the present application.
Figure 9:
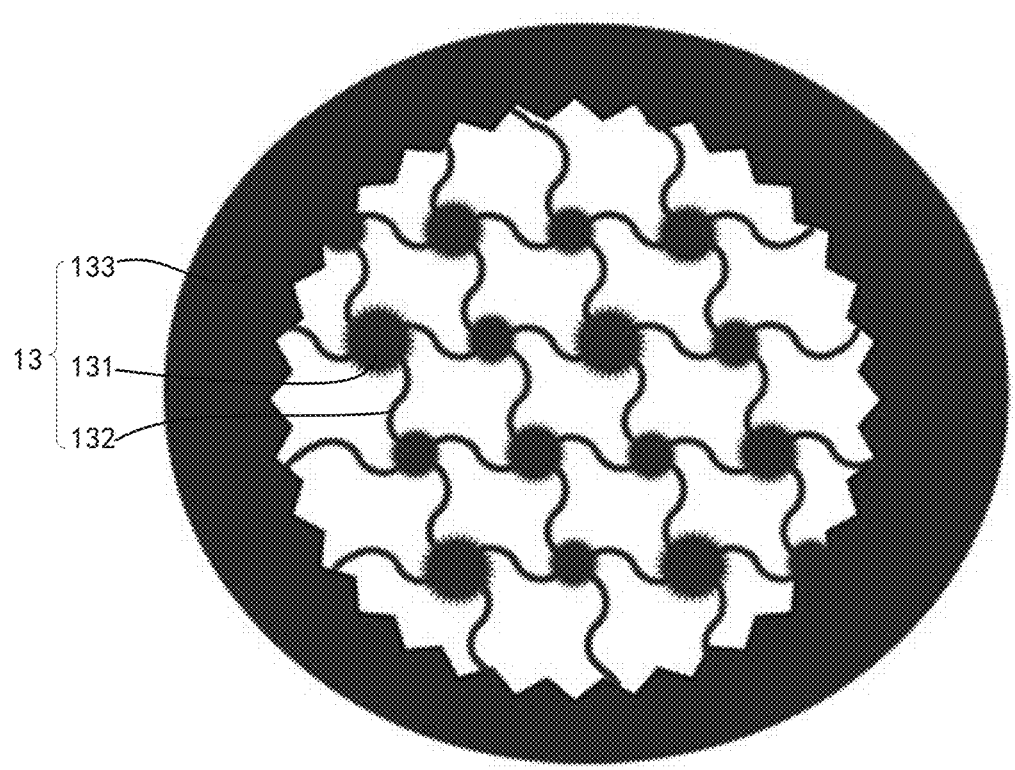
FIG. 9 is yet another top schematic diagram of the light shielding layer according to an embodiment of the present application.
Figure 10:
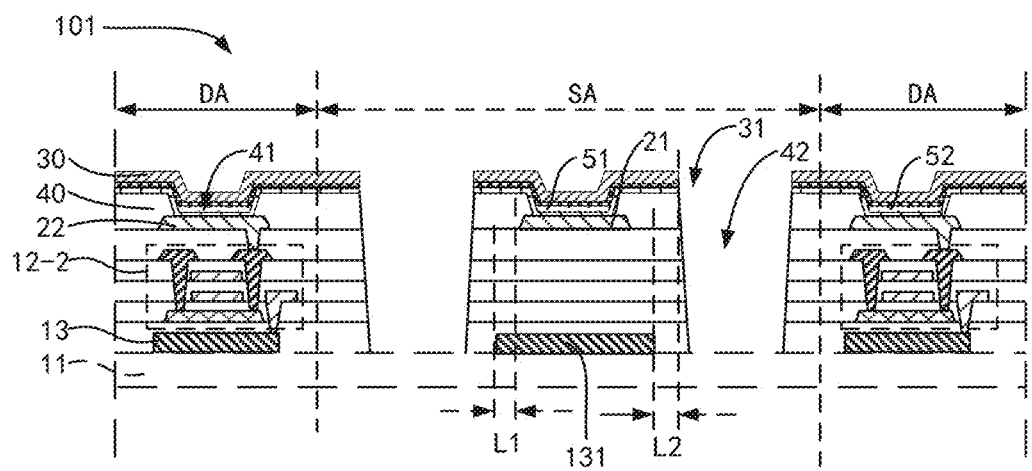
FIG. 10 is another cross-sectional structural schematic diagram of a display panel according to an embodiment of the present application.

In an embodiment, referring to FIGS. 1 to 9, FIG. 8 is another top view structural schematic diagram of a light shielding layer according to an embodiment of the present application, and FIG. 9 is yet another top view structural schematic diagram of a light shielding layer according to an embodiment of the present application. In contrast to the above-described embodiment, a surface shape of at least one edge of the first light shielding portion 131, the second light shielding portion 132, and the third light shielding portion 133 of the light shielding layer 13 is a wave shape, a zigzag shape, or the like, to reduce diffraction of light. As shown in FIG. 8, the surface shape of the second light shielding portion 132 is the wave shape. As shown in FIG. 9, the surface shapes of the first light shielding portion 131 and the third light shielding portion 133 are zigzag shapes, and the surface shape of the second light shielding portion 132 is the wave shape. For other descriptions, refer to the above embodiment, which will not be repeated here.

In an embodiment, referring to FIGS. 1 to 11, FIG. 10 is an another cross-sectional structural schematic diagram of a display panel according to an embodiment of the present application, and FIG. 11 is another cross-sectional structural schematic diagram of a second electrode layer before patterning according to an embodiment of the present application. In contrast to the above-described embodiment, the drive substrate 10 of the display panel 101 is provided with a third opening 42 at a position corresponding to the first opening 31, the third opening 42 extends through at least the pixel definition layer 40 to further improve the light transmittance of the first display area SA.

Optionally, the third opening 42 extends through the pixel definition layer 40 and a part of the film layers below the pixel definition layer 40 (e.g., the planarization layer 144, the interlayer insulating layer 143, etc.). For example, a bottom surface of the third opening 42 extends to the light shielding layer 13 and is disposed on a same layer as a bottom surface of the first light shielding portion 131, thereby further improving the light transmittance of the first display area SA.

Specifically, as shown in FIG. 11, the sacrificial layer 80 is disposed in a same layer as the light shielding layer 13, and the sacrificial layer 80 is located in an area defined by the light shielding portions (including the first light shielding portion 131, the second light shielding portion 132, and the third light shielding portion 133) of the light shielding layer 13. The third opening 42 extends through the pixel definition layer and the film layers below the pixel definition layer 40 to the sacrificial layer 80, thereby exposing the sacrificial layer 80. Portions of the first functional film layer 60, the second functional film layer 70, and the second electrode layer 30 are located on the sacrificial layer 80 within the third opening 42, and the second electrode layer 30 above the sacrificial layer 80 is brought up to form the first opening 31 when the sacrificial layer 80 is removed by laser light. For other descriptions, refer to the above embodiment, and details are not described here.

Based on a same inventive concept, the present application further provides a display panel preparation method. Referring to FIGS. 1 to 12, FIG. 12 is a flowchart of a display panel preparation method according to the embodiment of the present application. The display panel preparation method comprises the following steps:

S301: preparing a drive substrate 10 divided into a first display area SA and a second display area DA, wherein a light transmittance of the first display area SA is greater than a light transmittance of the second display area DA;

S302: preparing a first electrode layer 20 on a side of the drive substrate 10, and patterning the first electrode layer 20;

S303: preparing a light emitting layer 50 on a side of the first electrode layer 20 away from the drive substrate 10, wherein the light emitting layer 50 includes a plurality of first pixels 51 disposed in the first display area SA and a plurality of second pixels 52 disposed in the second display area DA;

S304: preparing a second electrode layer 30 on a side of the light emitting layer 50 away from the first electrode layer 20, patterning the second electrode layer 30 so that the second electrode layer 30 forms a first opening 31 between adjacent first pixels 51 in the first display area SA, wherein center points of a plurality of adjacent first pixels 51 around the first opening 31 define a first polygon 411, and a ratio of an area of the first opening 31 to an area of a corresponding first polygon 411 ranges from 50% to 95%.

Specifically, in step S301, the step of preparing the drive substrate 10 includes: providing a substrate 11, preparing a light shielding layer 13 and a sacrificial layer 80 on the substrate 11, wherein the light shielding layer 13 includes a first light shielding portion 131, a second light shielding portion 132, and a third light shielding portion 133 in the first display area SA, the sacrificial layer 80 is disposed on a same layer as the light shielding layer 13, and the sacrificial layer 80 is located in an area defined by light shielding portions (including the first light shielding portion 131, the second light shielding portion 132, and the third light shielding portion 133) of the light shielding layer 13. The sacrificial layer is separated from the light shielding layer 13, and a minimum distance between the sacrificial layer 80 and the light shielding layer 13 is greater than 1 μm, wherein a thickness of the sacrificial layer 80 is less than a thickness of the light shielding layer 13.

Specifically, in step S302, the step of patterning the first electrode layer 20 includes: forming a plurality of first electrode blocks 21 arrayed in the first display area SA and forming a plurality of second electrode blocks 22 arrayed in the second display area DA by a yellow light process.

Specifically, in step S303, the step of preparing the light emitting layer 50 includes: preparing a pixel definition layer 40 on the first electrode layer 20 and the drive substrate 10, patterning a pixel definition layer 40 to form a pixel opening 41, and preparing the light emitting layer 50 within the pixel opening 41. Wherein a first pixel 51 is formed in the pixel opening 41 corresponding to the first electrode block 21 and a second pixel 52 is formed in the pixel opening 41 corresponding to the second electrode block 22.

Specifically, in step S304, the step of patterning the second electrode layer 30 to form the first opening 31 further includes:

Preparing a third opening 42 on the drive substrate 10 in the first display area SA, wherein the third opening 42 extends through at least the pixel definition layer 40. Specifically, the third opening 42 extends through the pixel definition layer 40 and a part of the film layers below the pixel definition layer 40, for example, the third opening 42 extends through the pixel definition layer 40 and the film layers below the pixel definition layer 40, and to the sacrificial layer 80, thereby exposing the sacrificial layer 80;

Preparing a second electrode layer 30 in the pixel definition layer 40, the pixel opening 41, and the third opening 42 such that the second electrode layer 30 covers the sacrificial layer 80;

Irradiating first display area SA with a laser to remove the sacrificial layer 80 and the second electrode layer 30 corresponding to the sacrificial layer 80, so that the second electrode layer 30 forms the first opening 31.

Alternatively, the first opening 31 of the second electrode layer 30 may also be prepared by the following method:

Preparing a drive substrate 10 and a first electrode layer 20 on the drive substrate 10, wherein the step of preparing the drive substrate includes providing a substrate 11, and preparing a light shielding layer 13 on the substrate 11;

Preparing a pixel definition layer 40 on the first electrode layer 20 and the drive substrate 10, and patterning the pixel definition layer 40 to form a pixel opening 41;

Preparing a sacrificial layer 80 on the pixel definition layer 40 between the pixel openings 41, wherein a thickness of the sacrificial layer 80 is less than a thickness of the light shielding layer 13, an orthographic projection of the sacrificial layer 80 on the substrate 11 is separated from an orthographic projection of the light shielding layer 13 on the substrate 11, and a minimum distance between an outer contour of the orthographic projection of the sacrificial layer 80 on the substrate 11 and an outer contour of the orthographic projection of the light shielding layer 13 on the substrate 11 being greater than 1 μm;

Preparing a second electrode layer 30 in the pixel definition layer 40, the sacrificial layer 80, and the pixel opening 41 such that the second electrode layer 30 covers the sacrificial layer 80;

Irradiating the first display area SA with a laser to remove the sacrificial layer 80 and the second electrode layer 30 corresponding to the sacrificial layer 80, so that the second electrode layer 30 forms the first opening 31.

In an embodiment, an embodiment of the present application further provides a display device including a functional element disposed on a display panel 100 according to one of the above-described embodiments, wherein the functional element is disposed on a non-light-emitting side of a first display area SA of the display panel 100. The display device includes a mobile phone, a television, a tablet computer, a wearable electronic device, and the like.

According to the above-described embodiment:

The present application provides a display panel, a preparation method thereof, and a display device, wherein the display panel includes a first display area and a second display area, a light transmittance of the first display area is greater than that a light transmittance of the second display area, the display panel further includes a drive substrate, a first electrode layer located on a side of the drive substrate, a light emitting layer located on a side of the first electrode layer away from the drive substrate, and a second electrode layer located on a side of the light emitting layer away from the first electrode layer. The light emitting layer includes a plurality of first pixels disposed in the first display area and a plurality of second pixels disposed in the second display area, wherein the second electrode layer is provided with a first opening between adjacent first pixels in the first display area, center points of the plurality of adjacent first pixels around the first opening define a first polygon, and a ratio of an area of the first opening to an area of the corresponding first polygon ranges from 50% to 95%. In the present application, the second electrode layer is provided with a first opening between adjacent first pixels corresponding to the first display area, so as to improve a light transmittance of the first display area, thereby solving a problem of a poor light transmittance of a display screen in which a conventional under-screen camera technology is applied.

In the above-described embodiments, the descriptions of the various embodiments are each focused, and parts of some embodiments that are not detailed may be referred to the related descriptions of other embodiments.

The above-described embodiments of the present application are described in detail, and the principles and embodiments of the present application are described by using specific examples herein. The above-described embodiments are merely intended to help understand the technical solutions and core ideas of the present application. Those of ordinary skill in the art will appreciate that they may still modify the technical solutions described in the foregoing embodiments, or equivalently replace some of the technical features therein. These modifications or substitutions do not deviate the nature of the respective solutions from the scope of the solutions of the embodiments of the present application.

What is claimed is:

1. A display panel, comprising a first display area and a second display area, wherein a light transmittance of the first display area is greater than a light transmittance of the second display area, the first display area comprises a translucent sub-area, and a transition sub-area between the translucent sub-area and the second display area, and the display panel further comprises:
    a drive substrate;
    a first electrode layer located on a side of the drive substrate;
    a light emitting layer located on a side of the first electrode layer away from the drive substrate, wherein the light emitting layer comprises a plurality of first pixels disposed in the first display area and a plurality of second pixels disposed in the second display area; and
    a second electrode layer located on a side of the light emitting layer away from the first electrode layer;
    wherein in the first display area, the second electrode layer is provided with a first opening between adjacent first pixels of the plurality of first pixels, center points of a plurality of adjacent first pixels around the first opening define a first polygon, and a ratio of an area of the first opening to an area of a corresponding first polygon ranges from 50% to 95%; and
    wherein the drive substrate comprises:
    a substrate;
    a drive circuit layer disposed between the substrate and the light emitting layer, wherein the drive circuit layer comprises a plurality of first transistors corresponding to the plurality of first pixels, a plurality of second transistors corresponding to the plurality of second pixels, and a plurality of first signal traces electrically connected to the plurality of first transistors;
    a light shielding layer disposed between the substrate and the drive circuit layer, wherein the light shielding layer comprises:
        a plurality of first light shielding portions disposed corresponding to the plurality of first pixels;
        a plurality of second light shielding portions disposed in the first display area and overlapped with the plurality of first signal traces, and each of the plurality of second light shielding portions is electrically connected between the adjacent first light shielding portions; and
        a third light shielding portion disposed around the plurality of first light shielding portions and the plurality of second light shielding portions;
        wherein the third light shielding portion and the transition sub-area at least partially overlap, and each of the plurality of second light shielding portions is further connected between the third light shielding portion and the plurality of first light-shielding portions adjacent to the third light shielding portion.

2. The display panel according to claim 1, wherein the first electrode layer comprises a plurality of first electrode blocks corresponding to the plurality of first pixels and a plurality of second electrode blocks corresponding to the plurality of second pixels;
    center points of a plurality of adjacent first electrode blocks of the plurality of the first electrode blocks around the first opening define a second polygon, and a ratio of the area of the first opening to an area of a corresponding second polygon ranges from 50% to 95%.

3. The display panel according to claim 1, wherein center points of a plurality of adjacent first light shielding portions of the plurality of the first light shielding portions around the first opening define a third polygon, and a ratio of the area of the first opening to an area of a corresponding third polygon ranges from 50% to 95%.

4. The display panel according to claim 3, wherein a number of the plurality of first pixels in a unit area is same as a number of the plurality of second pixels in a unit area.

5. The display panel according to claim 1, wherein the first opening is provided corresponding to an area defined by the plurality of first light shielding portions and the plurality of second light shielding portions adjacent to each other, or corresponding to an area defined by the plurality of first light shielding portions, the plurality of second light shielding portions, and the third light shielding portion adjacent to each other.

6. The display panel according to claim 1, wherein an edge of at least one of the plurality of first light shielding portions, the plurality of second light shielding portions, and the third light shielding portion has a wave shape or a zigzag shape.

7. The display panel according to claim 1, wherein the plurality of first transistors are disposed in the transition sub-area, or the plurality of first transistors are disposed in the translucent sub-area and between the plurality of first light shielding portions and the plurality of first pixels.

8. The display panel according to claim 1, wherein the light emitting layer is provided with a second opening in the first display area corresponding to the first opening, center points of the plurality of adjacent first pixels around the second opening define the first polygon, and a ratio of an area of the second opening to an area of the corresponding first polygon ranges from 50% to 95%.

9. The display panel of claim 8, wherein the drive substrate further comprises:
a pixel definition layer disposed between the drive circuit layer and the light emitting layer;
wherein the drive substrate is provided with a third opening corresponding to the first opening, and the third opening extends through at least the pixel definition layer.

10. The display panel according to claim 9, wherein a bottom surface of the third opening extends to the light shielding layer and is located on a same layer as a bottom surface of the plurality of first light shielding portions.

11. The display panel according to claim 1, wherein a minimum distance between the first opening and the plurality of first pixels adjacent to the first opening is greater than or equal to 2 μm.

* * * * *